(12) United States Patent
Su et al.

(10) Patent No.: US 7,221,974 B1
(45) Date of Patent: May 22, 2007

(54) UNEVEN-COUNTER-ROTATIONAL COIL BASED MRI RF COIL ARRAY

(75) Inventors: Sunyu Su, Hudson, OH (US); Mark Xueming Zou, Aurora, OH (US); Joseph Murphy-Boesch, Aurora, OH (US)

(73) Assignee: General Electric Company, Schenectady, NY (US)

( * ) Notice: Subject to any disclaimer, the term of this patent is extended or adjusted under 35 U.S.C. 154(b) by 698 days.

(21) Appl. No.: 10/085,347

(22) Filed: Feb. 27, 2002

Related U.S. Application Data

(60) Provisional application No. 60/273,092, filed on Mar. 2, 2001.

(51) Int. Cl.
*A61B 5/055* (2006.01)
(52) U.S. Cl. .................. 600/422; 324/318
(58) Field of Classification Search ......... 600/422, 600/410, 15, 13, 421; 324/309, 318, 322
See application file for complete search history.

(56) References Cited

U.S. PATENT DOCUMENTS

| | | | |
|---|---|---|---|
| 4,825,162 A | 4/1989 | Roemer et al. | |
| 5,378,989 A * | 1/1995 | Barber et al. | 324/318 |
| 5,379,767 A * | 1/1995 | Derby et al. | 600/422 |
| 5,477,146 A * | 12/1995 | Jones | 324/318 |
| 5,578,925 A | 11/1996 | Molyneaux et al. | |
| 5,594,337 A | 1/1997 | Boskamp | |
| 5,680,047 A * | 10/1997 | Srinivasan et al. | 324/318 |
| 6,377,836 B1 * | 4/2002 | Arakawa et al. | 600/422 |
| 6,493,572 B1 * | 12/2002 | Su et al. | 600/422 |
| 2002/0013526 A1 * | 1/2002 | Su et al. | 600/422 |
| 2003/0109782 A1 * | 6/2003 | Su et al. | 600/421 |
| 2003/0114748 A1 * | 6/2003 | Su et al. | 600/422 |

OTHER PUBLICATIONS

D. I. Hoult, et al. "Quadrature Detection in the Laboratory Frame", Magnetic Resonance in Medicine 1, Received Oct. 17, 1983; Copyright 1984, pp. 339-353.
P.B. Roemer, et al., "The NMR Phased Array", Magnetic Resonance in Medicine 16, Received Jun. 2, 1989; Revised Oct. 3, 1989; Copyright 1990, pp. 192-225.
C. Leussler, et al, "Improvement of SNR at Low Field Strength Using Mutually Decoupled Coils for Simultaneous NMR Imaging", SMRM 1990 Annual Meeting Proceedings, pp. 724.
T. Takahashi, et al, "Head-neck Quadrature Multiple RF Coil for Vertical Magnetic Field MRI", SMRM 1997 Annual Meeting Procedeedings, pp. 1521.

* cited by examiner

*Primary Examiner*—Ruth S. Smith
(74) *Attorney, Agent, or Firm*—The Small Patent Law Group; Dean D. Small

(57) ABSTRACT

A MRI RF coil array is formed from a first coil having a null $B_1$ point and a quasi-one-peak sensitivity profile, and a second coil oriented with respect to the first coil to reduce coupling.

18 Claims, 6 Drawing Sheets

UNEVEN-COUNTER-ROTATIONAL COIL BASED MRI RF COIL ARRAY

CROSS-REFERENCE TO RELATED APPLICATION

This application claims the benefit of U.S. provisional patent application Ser. No. 60/273,092 filed Mar. 2, 2001.

BACKGROUND OF THE INVENTION

Magnetic resonance imaging (MRI) relies on the detection of the MR signal from abundant protons in the human body. A radio frequency (RF) receive coil is a device to effectively "pick up" the MR signal from the background of noise for image production. MR signals induced in a RF receive coil are weak signals due to the very small population difference between the two relevant proton energy states at room temperature. One of the challenges in RF coil design is to improve the MR signal detection sensitivity.

One of the approaches to improve signal detection sensitivity and/or field of view is to use multiple receive coils as an array. The basic idea is that instead of making a larger and less sensitive coil that covers the entire volume of interest, plural smaller and more sensitive coils are distributed over the volume of interest. Each individual coil picks up signal and noise from a localized volume. With separate detection circuitry, each coil element receives the image signal simultaneously. Signals from all the coils are finally combined and processed to reconstruct the MR image for the entire volume of interest.

The principle of MRI involves exciting protons and detecting the resulting free induction decay signals. Each proton possesses a tiny magnetic moment precessing about the static magnetic field. The macroscopic behavior of millions of protons can be represented by a resultant magnetization vector aligning with the static magnetic field $B_0$. A strong RF excitation pulse effectively tips the magnetization away from $B_0$. The free induction decay of this magnetization is detected in a plane perpendicular to $B_0$. Thus, for maximal signal induction, the normal direction of a receive coil must be perpendicular to the direction of the static magnetic field $B_0$.

Based on the direction of static magnetic field, commercial MRI systems are either horizontal or vertical. The so-called co-planar type coil arrays have proved to be effective for horizontal MRI systems for the reasons discussed in the previous paragraph. In a co-planar array, surface coils are arranged in a co-planar fashion and distributed over a volume of interest.

In general, such co-planar type surface coil arrays are not very effective for a vertical system because the condition required for maximal signal induction can hardly be fulfilled. Various modifications to the co-planar designs have been proposed with limited success.

It is known that solenoidal type coils have several advantages for a vertical field system, including its sensitivity, uniformity and its natural fit to various body parts. It is advantageous to utilize solenoidal based coil arrays for vertical MRI systems.

To successfully implement a solenoidal coil array, one must be able to isolate solenoidal coils of the array to prevent them from coupling to each other. This is required because all coils in a coil array typically receive signals simultaneously. "Cross-talk" between different coils is undesirable. Thus effective coil isolation is a major challenge in solenoidal coil array design.

A so-called sandwiched solenoidal array coil (SSAC) has been set forth in U.S. patent application Ser. No. 09/408,506. A SSAC consists of two solenoidal receive coils, a counter-rotational solenoidal coil and a second solenoidal coil sandwiched between the two counter-rotational winding sections of the first coil.

The counter-rotational solenoidal coil produces a gradient B1 field that has a double-peak "M" shape sensitivity profile. The second solenoidal coil produces a single-peak profile sandwiched between the two peaks of the "M" shape profile of the first coil.

The sensitivity profile of a SSAC is determined by the summation of an "M" shape double-peak profile and a centralized single-peak profile generated by the two coils. To avoid unwanted dark band artifacts in the array coil sensitivity profile, the geometric parameters of both coils must be set properly. This process is sensitive to the geometries at hand.

SUMMARY OF THE INVENTION

A MRI RF coil array is formed from a first coil having a null $B_1$ point and a quasi-one-peak sensitivity profile, and a second coil oriented with respect to the first coil to reduce coupling.

DESCRIPTION OF THE PREFERRED EMBODIMENTS

Figure 1:
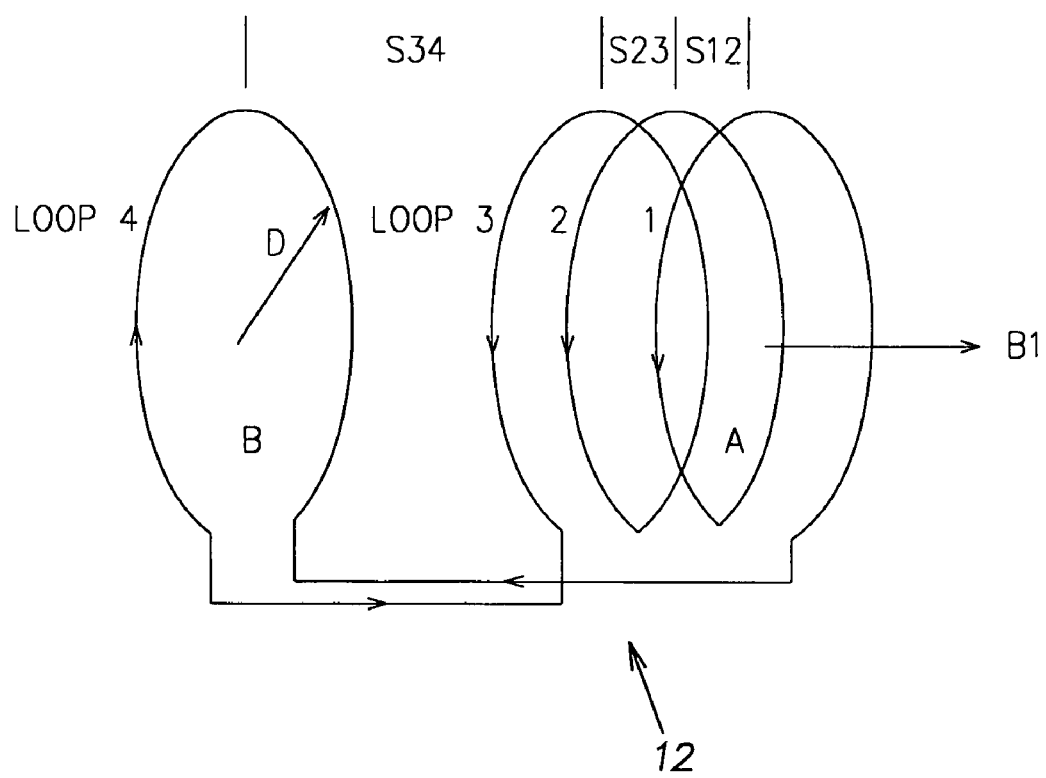
FIG. 1 is a schematic diagram of an uneven-counter-rotational solenoidal coil.

Referring to FIG. 1, an uneven-counter-rotational (UCR) coil 12 is illustrated. The coil 12 is formed from a first coil section A and a second coil section B. Section A has more turns than section B, for example, 3 verus 1. Section B is wound in the opposite direction from section A. For example, section A has three turns with the current flowing in the same direction and section B has one turn with current flowing in a counter-rotational direction. The separation between the neighboring turns is denoted as S12, S23 and S34, respectively. In general, the turn separation and diameter parameters may have different values depending on the specific coil design needs.

Figure 2A:
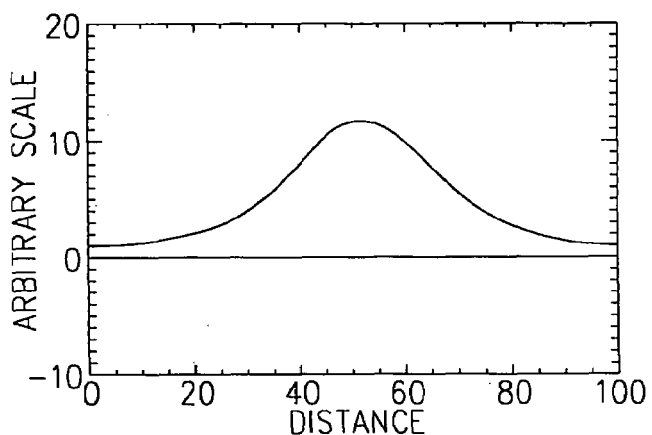
FIG. 2 is a graphical diagram of exemplary B1 and sensitivity profiles of an uneven-counter-rotational solenoidal coil according to the invention.
Figure 2B:
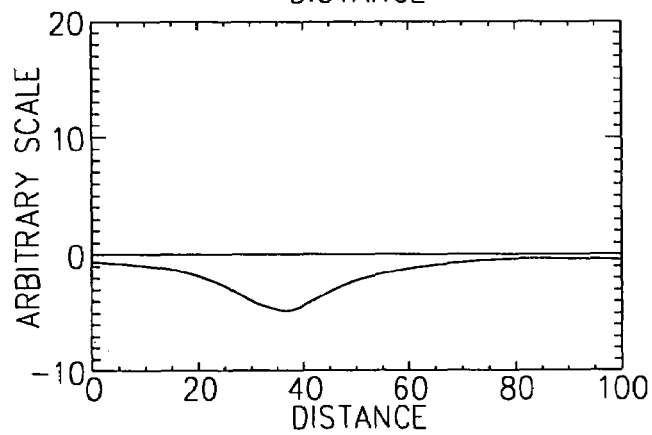
Figure 2C:
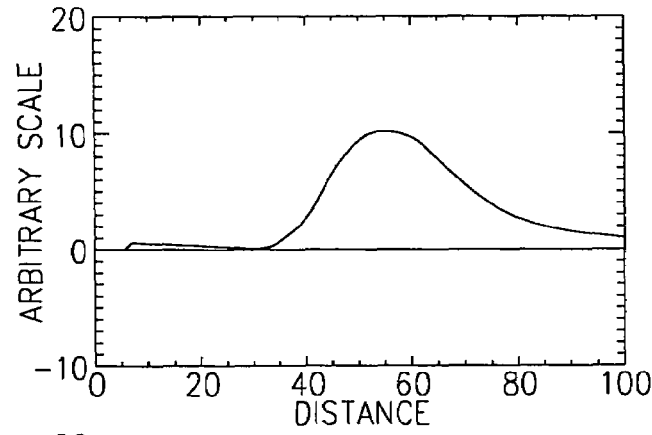
Figure 2D:
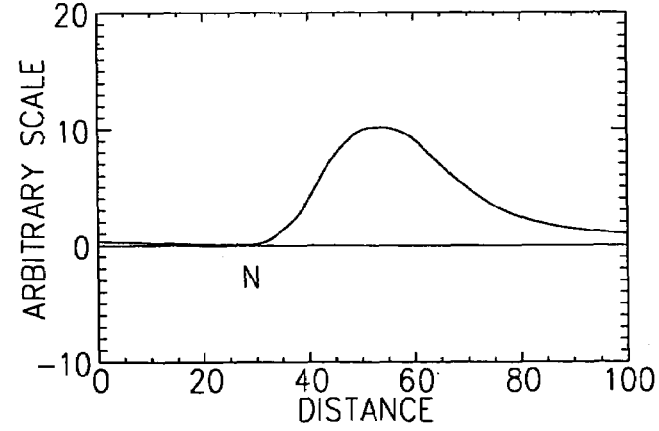

For example, the parameters may be as follows: S12=8 cm, S23=7 cm, S34=10 cm and D=26.7 cm. FIGS. 2a and 2b show the B1 field produced by the sections A and B, respectively. FIG. 2c shows the total B1 field produced by the UCR solenoidal coil 12. The sensitivity profile is shown in FIG. 2d. It can be seen from FIG. 2d that the UCR coil 12 generates a null-B1 point near location N and a quasi-one-peak sensitivity profile.

Figure 4:
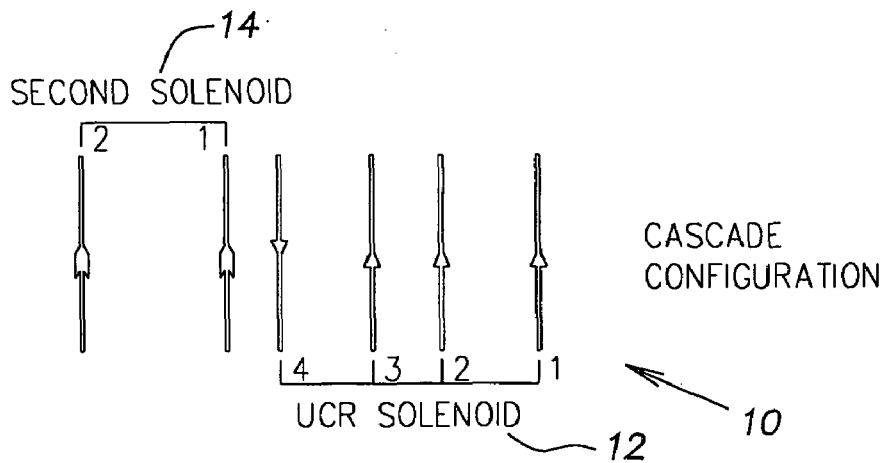
FIG. 4 is a schematic diagram of a coil array according to the invention in a cascade configuration.
Figure 5:
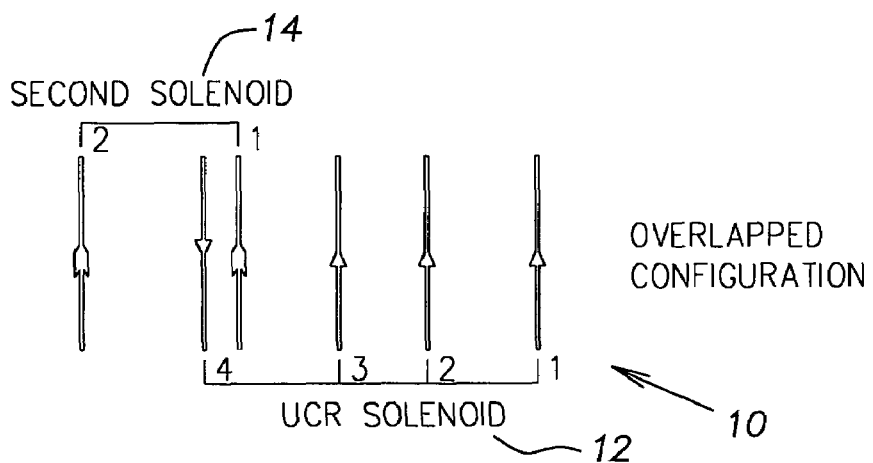
FIG. 5 is a schematic diagram of a coil array according to the invention in an overlapped configuration.
Figure 6:
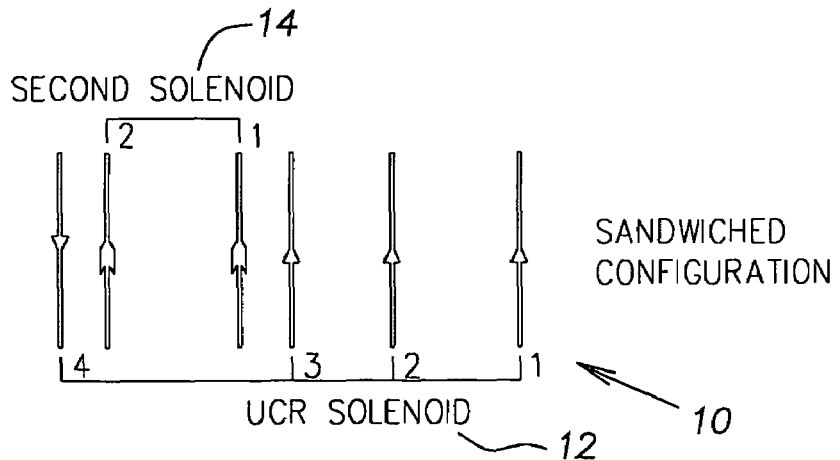
FIG. 6 is a schematic diagram of a coil array according to the invention in a sandwiched configuration.

Referring to FIGS. 4, 5 and 6, a second solenoidal coil 14 may be placed near the null-B1 point to form a solenoidal array with the UCR coil 12 while achieving good isolation between the two solenoidal coils 12, 14. In practice, an additional isolation capacitor may be used for the convenience of fine isolation adjustment if needed.

Figure 3:
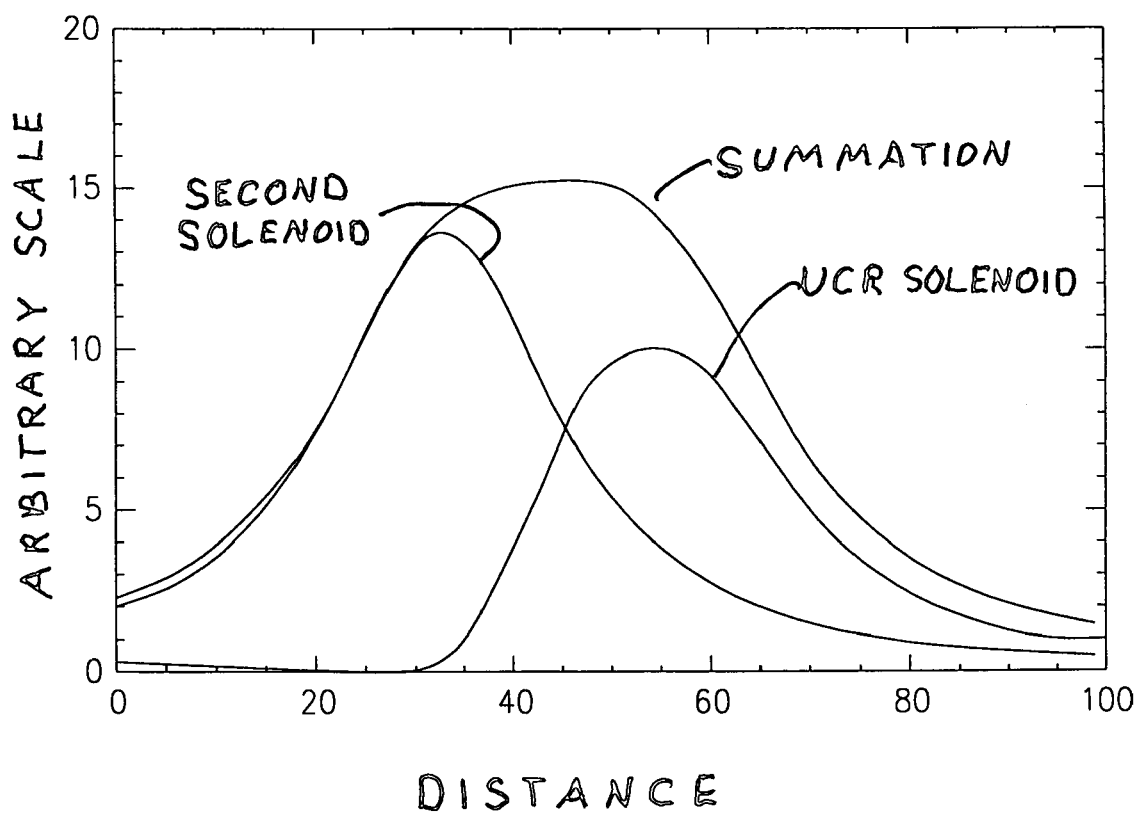
FIG. 3 is a graphical diagram of an exemplary sensitivity profile of a coil array according to the invention as a superposition of two individual solenoidal coils.

The second solenoidal coil 14 may, for example, be formed of multiple turns as needed. The number of turns and the separation between neighboring turns can be chosen to give a desired sensitivity profile and B1 strength. The corresponding sensitivity profile of the coil 14 partially overlaps with the profile of the UCR coil 12 to determine the sensitivity of the solenoidal coil array. FIG. 3 shows an example of a solenoidal coil array profile as the summation of the two solenoidal coils 12, 14. FIG. 3 shows an artifact free array profile and the advantage of a quasi-one-peak UCR sensitivity profile design. A quasi one-peak profile for the UCR solenoidal coil 12 can be achieved by intentionally making the two peaks in the typical "M" shape profile uneven, i.e. the B1 field produced by one winding section of the UCR coil element is much stronger than the other. At the same time, the null-B1 point is retained in the quasi-one-peak profile, which is the basis for the inherent decoupling of the two solenoidal coils 12, 14. This can be accomplished by properly choosing the number of turns, their diameters and locations for each of the two winding sections.

A better understanding of the uneven-counter-rotational design, its quasi-one-peak profile and coil isolation between the two solenoidal coils of the array can be achieved by a closer look from the electromagnetic field point of view. First, the three turns in section A of the UCR coil 12 generate a strong B1 field as shown in FIG. 2a. The B1 field decreases gradually along the axis away from the section center. In fact, it approaches zero B1 at infinite distance from the center. If one would introduce a second solenoidal coil in a short distance from the section center, one would encounter strong coupling between the two coils.

Section B generates a B1 field of opposite direction to that of section A. Section B generates a negative B1 field of smaller peak value and different profile shape than that by section A. At certain location, the B1 field generated by sections A and B may cancel, forming a null-B1 point in the combined B1 profile of this UCR coil as shown in FIG. 2c. By definition, the solenoidal coil 14 introduced to the location where the B1 field generated by sections A and B of the UCR coil 12 cancel experiences no magnetic coupling with the UCR coil 12. The null-B1 point can be set to be outside the UCR sections A, B, between the two UCR sections A, B or overlapped with one of the UCR sections.

The B1 field generated by the counter-rotational section B may cancel that by element A at different locations along the axis depending on relative field strength. Accordingly, the solenoidal coil array may have cascaded 10 (FIG. 4), overlapped 10' (FIG. 5) or sandwiched 10" (FIG. 6) configurations depending on if the second solenoidal coil 14 is outside the UCR solenoidal coil 12, overlapped with section B of the UCR coil 12 or inside the UCR coil 12, respectively. In any case, the solenoidal array is UCR-based and is conceptually different from and more advanced than the previous "sandwiched solenoidal array" due to the advantages associated with the quasi-one-peak profile feature of the UCR design.

In a UCR-based solenoidal array, each coil is subjected to noise pickup from a smaller region just like other types of array coil. The array coil advantages in terms of signal to nose ratio and field of view improvement applies to the UCR solenoidal array as disclosed in this invention.

A prototype UCR solenoidal array was built to prove the concept. The prototype solenoidal array coil included a UCR solenoidal coil and a 2-turn solenoidal coil. The solenoidal coil array was built for a 0.3T Hitachi Airis II imaging system at the resonance frequency of 12.687 MHz.

Figure 7:
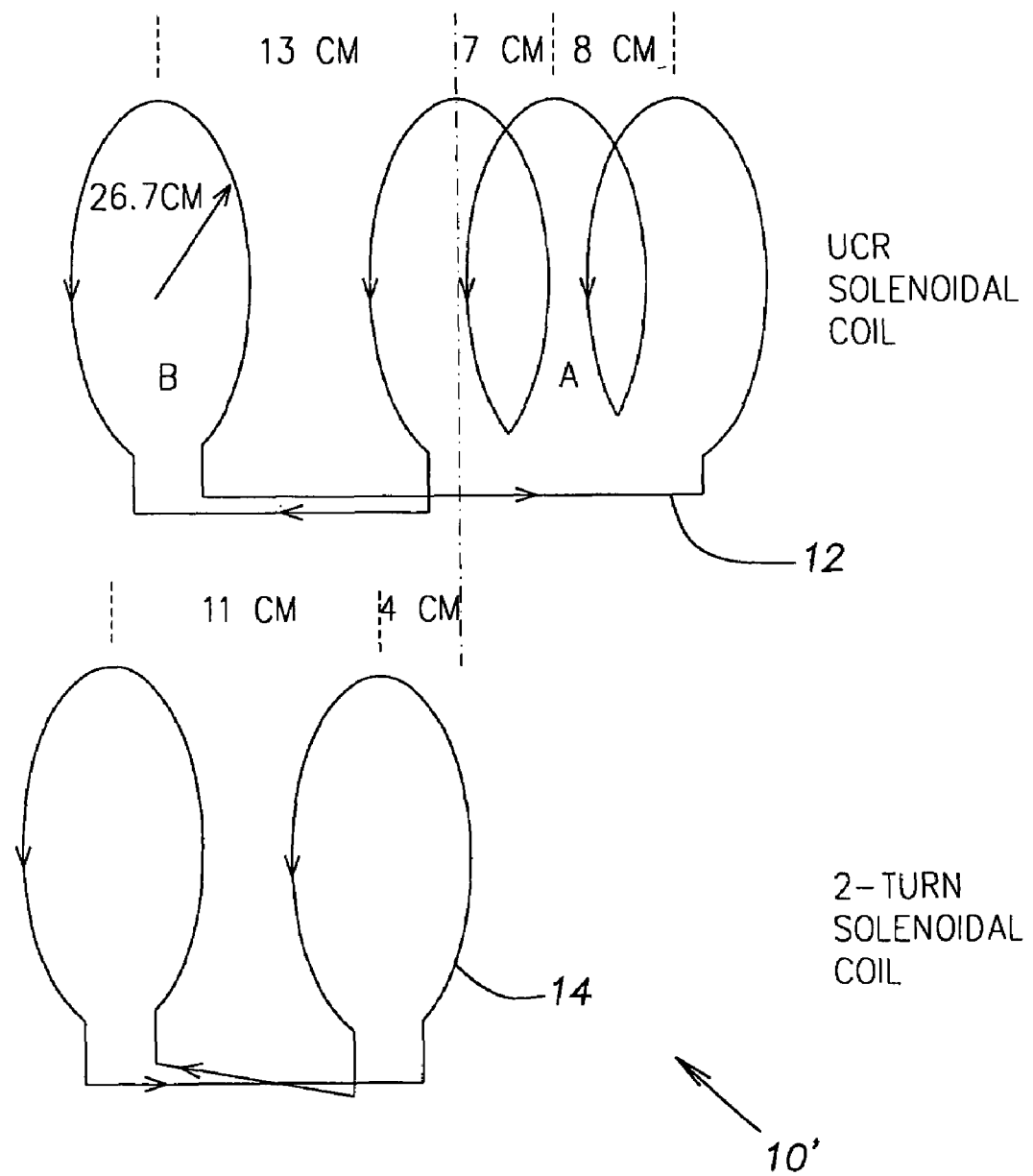
FIG. 7 is a schematic diagram of an embodiment of the invention showing spacing parameters.

The coil traces were made of 0.2 mm thick, 10 mm wide, copper strips wound on a 267 mm diameter acrylic tube. The two solenoidal coils of the array were in overlapped configuration, meaning that the 2-turn solenoidal coil 14 overlaps with the section B of the UCR coil 12. The geometric parameters are shown in FIG. 7. The coils 12, 14 are shown on separate axes for ease of understanding.

Figure 8:
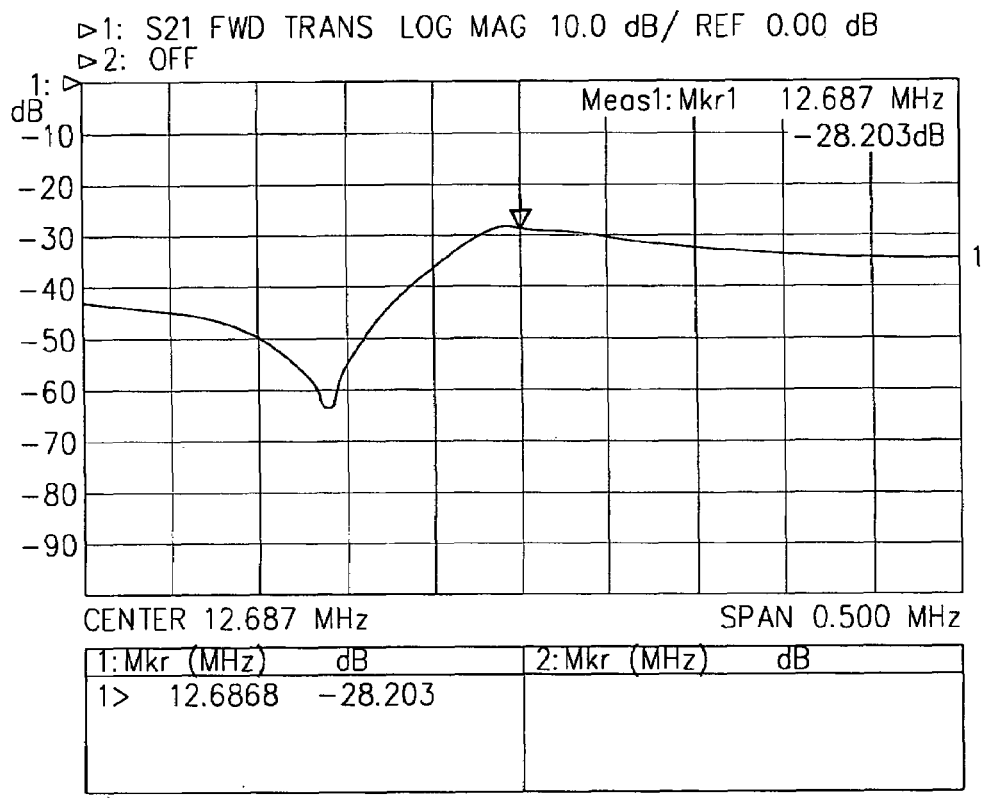
FIG. 8 is a graphical diagram of an exemplary coupling sensitivity between the two coils of the array of FIG. 7.

The two solenoidal coils 12, 14 are inherently decoupled. Excellent isolation was achieved between the two coils without any additional isolation circuitry. The transmission parameter S21 is -28 dB at resonance frequency, as shown in FIG. 8.

Figure 9:
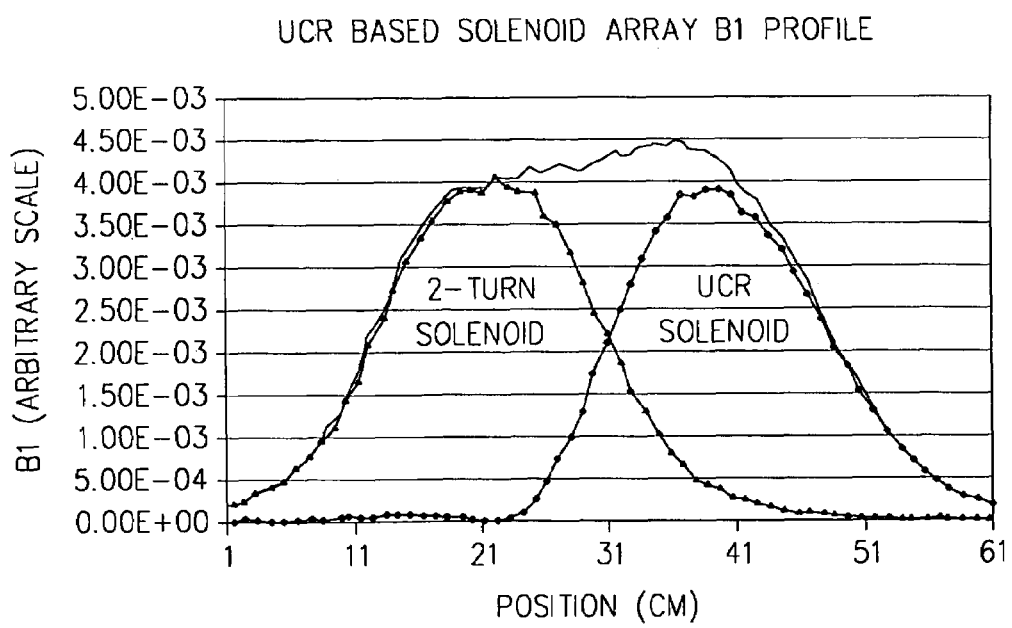
FIG. 9 is a graphical diagram of a B1 profile for coil array of FIG. 7.

The B1 field along the axial direction was measured for each solenoidal coil alone, with the other coil active. The results are shown in FIG. 9. Also shown is the combined solenoidal array B1 profile. The UCR solenoidal coil 12 has a quasi-one-peak profile with a null-B1 point residing at about the middle of the coil 14 profile. The summation of individual profiles gives a nice total array profile without artifacts.

The array coil of the invention need not be just solenoidal coils. For example, an orthogonal coil element, such as a saddle coil, may be added to form a quadrature pair with each solenoidal coil. Therefore, a two-solenoidal coil array can be easily developed to be a two-quadrature-pair solenoidal array coil to take advantage of quadrature effect in signal to noise ratio improvement.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A MRI RF coil array, said array comprising:
   a first coil having a null $B_1$ point and a quasi-one-peak sensitivity profile with only one peak; and
   a second coil oriented with respect to said first coil to reduce coupling.

2. A MRI RF coil array according to claim 1, wherein said second coil is within said first coil.

3. A MRI coil array according to claim 1, wherein said second coil overlaps said first coil.

4. A MRI coil array according to claim 1, wherein said second coil is cascaded with said first coil.

5. A MRI coil array according to claim 1, wherein said second coil is solenoidal.

6. A MRI RF coil array according to claim 1, wherein said second coil is placed near the null $B_1$ point.

7. A MRI RF coil array according to claim 1, wherein said first coil comprises a plurality of winding sections with the $B_1$ field produced by one winding section stronger than the $B_1$ field produced by another winding section.

8. A MRI RF coil array according to claim 1, wherein said first coil comprises a plurality of winding sections, a number of the winding sections based on sensitivity parameters.

9. A MRI RF coil array according to claim 1, wherein said first coil comprises a plurality of winding sections and at least one of (i) a separation between winding sections and (ii) a diameter of the winding sections is based on sensitivity parameters.

10. A MRI RF coil array according to claim 1, wherein said second coil is positioned relative to said first coil based on $B_1$ field strength.

11. A MRI coil array, said array comprising:
   a first solenoidal coil having a first section and a second section, said first section having more turns than said second section and said second section having a counter-rotational orientation with respect to said first section, said first coil having a quasi-one-peak sensitivity profile with only one peak; and
   a second solenoidal coil, said second coil being oriented with respect to said first coil to reduce coupling.

12. A MRI coil array according to claim 11, wherein said second coil is oriented between said first and second sections.

13. A MRI coil array according to claim 11, wherein said second coil is oriented about said second section.

14. A MRI coil array according to claim 11, wherein said second coil is cascaded with said first coil.

15. A MRI coil array according to claim 11, further comprising an orthogonal coil forming a quadrature pair with each of said solenoidal coils.

16. A method for providing a MRI coil array, said method comprising:
   configuring a first coil having a null $B_1$ point and a quasi-one-peak sensitivity profile with only one peak; and
   configuring a second coil oriented with respect to said first coil to reduce coupling.

17. A method according to claim 16, wherein said second coil overlaps said first coil.

18. A method according to claim 16, wherein said second coil is cascaded with said first coil.

* * * * *